United States Patent [19]

Bluzer

[11] 4,135,248

[45] Jan. 16, 1979

[54] MEDIAN EXTRACTOR

[75] Inventor: Nathan Bluzer, Silver Spring, Md.

[73] Assignee: Westinghouse Electric Corp., Pittsburgh, Pa.

[21] Appl. No.: 841,238

[22] Filed: Oct. 11, 1977

[51] Int. Cl.² .......................................... G06F 15/36
[52] U.S. Cl. ................................. 364/575; 364/554; 364/715
[58] Field of Search ............... 364/200, 900, 554, 574, 364/575, 715, 734

[56] References Cited

U.S. PATENT DOCUMENTS

| | | | |
|---|---|---|---|
| 3,428,946 | 2/1969 | Batcher | 364/900 X |
| 3,446,949 | 5/1969 | Trimble | 364/574 |
| 3,558,917 | 1/1971 | Crouse | 307/235 |
| 3,700,803 | 10/1972 | Rhee | 178/7.3 R |
| 3,742,361 | 6/1973 | Wason | 325/346 |
| 3,748,449 | 7/1973 | King | 364/734 |
| 3,833,797 | 9/1974 | Grobman et al. | 364/574 |
| 3,925,650 | 12/1975 | Brown | 364/570 |
| 3,978,348 | 8/1976 | Henninger et al. | 307/229 |
| 4,030,077 | 6/1977 | Florence et al. | 364/900 |

*Primary Examiner*—Jerry Smith
*Attorney, Agent, or Firm*—W. E. Zitelli

[57] ABSTRACT

A system for processing a set of M base-one coded digital data words each having a capacity of N-bit levels for extracting a desired threshold data word therefrom is disclosed. An array of N M-stage shift registers are arranged to sequentially store each data word of the set in one of its columns. A data word is stored by shifting into the first column of the shift register rows only the bit levels of each data word which have a one status. This shifting operation renders a magnitude-related ordered set of the data words in the columns of the array. A predetermined column or columns may be tapped for extracting a data word representative of a desired threshold level of the contents of the array. In an alternative embodiment, a sequential train of similar base-one coded data words may be processed for extracting a desired data word from each of the most recent M data words of the train. This alternative embodiment is operative to perform shifting operations based on bit level comparisons of each data word ready for storage M + i and each corresponding data word i which is the oldest stored in the array. Similarly, a magnitude related ordered set is formed in the columns of the array with each most recent M data words of the train and likewise, a column or columns may be tapped for extracting the desired data word of each ordered set.

21 Claims, 12 Drawing Figures

(a) CLOCK (b) CLOCK 1

(c) $\overline{\text{CLOCK}}$ (d) CLOCK 2

(e) $\phi'_1$ (f) $\phi'_2$ (g) $\phi'_3$ (h) $\phi'_4$ (j) STROBE  P1 P2 P3 P4

MEDIAN EXTRACTOR

GOVERNMENT CONTRACT

The invention herein described was made under Government Contract No. DAAG53-76-C-0138 or a subcontract thereunder with the Defense Advanced Research Project Agency (DARPA).

BACKGROUND OF THE INVENTION

The present invention relates broadly to signal processing systems, and more particularly to a system for extracting a threshold value of interest, such as the median value, from a set of data values.

Many of the electronic data processors of today are required to monitor selected physical parameters of a defined system to provide feedback data required for the supervisory and/or automatic control of the defined system. In some cases, these defined systems must be controlled in real time whereby the feedback data must be monitored in relation to time. These monitored parameters may be a pressure, a temperature, or even an optical image, but are generally not electrical in nature unless dealing with an electrical power system, for example. Therefore, a transducer is normally provided to transform the physical measurement into an analog electrical representation thereof which is ultimately adapted for use by the data processor. Unfortunately, the environment surrounding the transducer is not always suitable to provide an ideal measurement of the physical parameter of interest. Usually, some undesirable background clutter is included with the desired parameter measurement and the composite signal may provide a false electrical representation of the system parameter to the data processor. For this reason, many of the feedback time related data signals are filtered by the data processor in an attempt to segregate the desired signal from the unwanted background clutter signals normally included therewith.

In one particular type of data processor which is primarily used for video or infrared imaging, statistical methods are employed to enhance the electrical signal representative of the desired target optical image and suppress any undesirable electrical signals representing background clutter images found therewith. One approach used for this type of system is to extract a median electrical amplitude value from the set of electrical amplitude values which constitute the image or portion thereof viewed by the optoelectronic transducer of the imaging system. The imaging system produces a substantial image of the target by blanking all the electrical amplitude values less than the median value. This type of statistical filtering approach may also be applied to other data processors related to temperature and pressure control, for example.

Most of the electronic data processors which include statistical methods for filtering input data signals, similar to the one just described, perform their operations digitally. The function involved in extracting the median value from a set of incoming data values may be implemented with a variety of digital counters and logic circuits, and the operation performed thereby is generally in sequential order. In some instances, one median extractor may be time shared with many signals for the purposes of statistically filtering each signal using the median value extracted therefrom. It is evident that an electronic data processor incorporating many monitored signals will spend a great deal of its processing time filtering each signal if a common median extractor is used in a time shared mode. On the other hand, if a median extractor of conventional design is incorporated into each data signal input channel to reduce the processing time for filtering each channel, the data processor would become overly burdened with hardware, not to mention the excessive costs involved and reliability aspects.

From the above discussion, it appears that there exists a need for a simple device for extracting various threshold values including the median from a set of input data values. Accordingly, such a device that could be implemented with large-scale-integration circuit technology to reduce the amount of hardware conventionally required and be capable of performing extraction operations concurrent with other operations of the data processor to reduce the amount of processing time required overall would certainly be desirable.

SUMMARY OF THE INVENTION

In accordance with the present invention, a system processes a set of M base-one digital data words each having a capacity of N-bit levels to extract a desired threshold value, for example a median, therefrom. The system comprises an M-stage shift register for each of the N levels of the base-one code which are arranged in N rows and M columns for storage of each of the M digital words in one of its columns, a means for arranging the bit pattern of the memory bank upon the storage of each digital data word in an ordered set of digital words based on the magnitude thereof and means for tapping the shift register stages of at least one predetermined column of said memory bank for extracting the digital word or words stored therein which at times may be representative of the described threshold value of the set of M digital data words. More specifically, the arranging means performs a one-bit shifting operation only on the shift register rows of the memory bank which are correspondingly associated with the bits of a digital word ready for storage that have been determined to have a digital one status and the shifting operation is in a direction to cause a digital one status to be stored into the input stage of the shifted rows of the memory bank.

Additionally, in accordance with the present invention, the system may continuously process a sequential train of base-one coded digital words each having a capacity of N-bit levels to extract a desired threshold digital data word from each most recent M digital data words of said train by including a control means. The memory bank is utilized for sequentially storing each of the most recent digital words of said sequential train wherein each data word which is ready for storage in the memory bank is denoted as M + i and the oldest data word which is correspondingly stored in the memory bank is denoted as i. The control means is governed by each M + i and corresponding i data words of said train of digital data words to perform a shifting operation on selected shift register rows of said memory bank to arrange the most recent M digital data words of said train in the columns of said memory bank in an ordered array based on the magnitudes thereof. A digital word or words may be extracted from the memory bank at appropriate times to yield the desired threshold value of the most recent M digital data words or a representative thereof. More specifically, the control means performs a shift right one-bit operation on the shift registers associated with the bit levels of each M + i digital word which has a status substantially greater in magnitude than the corresponding bit levels of the respective i digital word associated therewith to cause a status of one to be stored into each first stage of said right shifted shift registers and performs a shift left one-bit operation on the shift registers associated with the bit levels of each M + i digital word which has a status substantially lower in magnitude than the corresponding bit levels of the respective i digital word associated therewith to cause a status of zero to be stored into each Mth stage of said left shifted shift registers. Further, it is preferred that the control means performs both the shift right and shift left operations concurrently with the storage of each M + i digital word of said sequential train of digital words in said memory bank.

When the corresponding bit levels of the i and M + i words have magnitudes which are substantially equal, no shifting operation occurs in the shift register rows associated therewith.

DESCRIPTION OF PREFERRED EMBODIMENT

Figure 1:
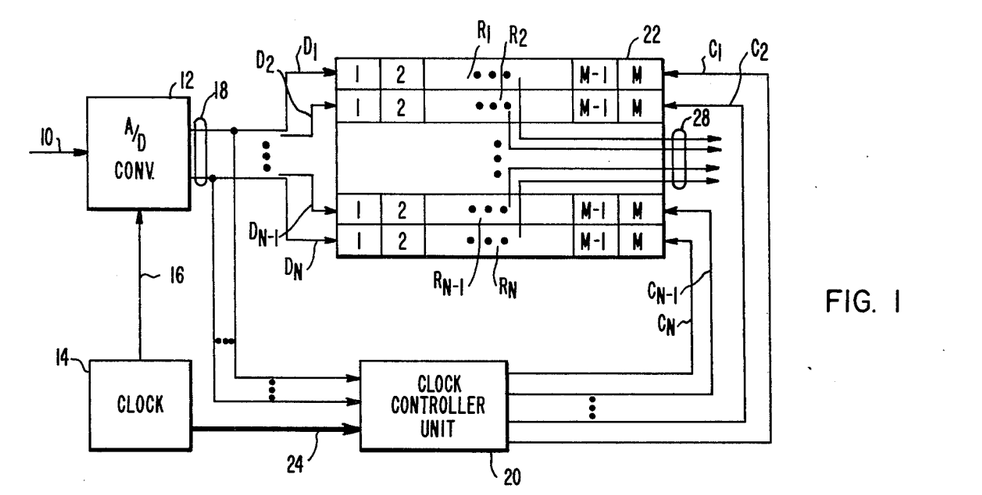
FIG. 1 is a schematic block diagram of a processing system which may be used to embody the present invention.

In FIG. 1 is a block diagram schematic of a processing system in which the present invention may be embodied. An analog signal 10 may be coupled to a conventional A/D converter 12 which is adapted to provide base-one coded digital output words. A typical clock circuit 14 may control the sampled conversions of the A/D converter over control line 16. Digital outputs 18 comprising $D_1, D_2, \ldots, D_{N-1}, D_N$ of the A/D converter 12 may be coupled to a clock controller 20 and a memory bank 22. The memory bank 22 comprises N shift registers $R_1, R_2, \ldots, R_{N-1}, R_N$ each having a capacity of M stages aligned in N rows and M columns. Each digital output line $D_1, D_2, \ldots, D_{N-1}, D_N$ may be individually coupled in corresponding consecutive order to the inputs of the N shift registers $R_1, R_2, \ldots, R_{N-1}, R_N$ of the memory bank 22. The clock controller 20 having clock inputs 24 derived from the clock circuit 14 individually controls the shifting operations of each shift register $R_1, R_2, \ldots, R_{N-1}, R_N$ comprising the memory bank 22 utilizing clock signals $C_1, C_2, \ldots, C_{N-1}, C_N$, respectively. A set of readout taps 28 from which one tap may be coupled to each shift register stage of a predetermined column of the memory bank 22 to permit extraction of the digital word stored therein.

Figure 2:
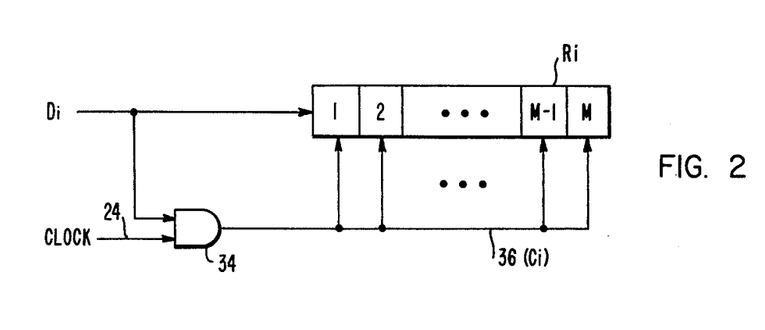
FIG. 2 is a schematic block diagram of one of the N-bit levels of a shift register with clock controller which is suitable for use in the embodiment shown in FIG. 1.

A simple schematic of a clock controller for the $R_i$ shift register of the memory bank 22 which is typical of all the clock controllers of the clock controller unit 20 and considered suitable for the embodiment described in connection with FIG. 1 is shown in FIG. 2. The $D_i$ line of the digital outputs 18 is correspondingly coupled to the $R_i$ shift register of the memory bank 22 and to an ith "AND" gating function 34. A second input to the "AND" gate 34 is derived from the clock signals 24 and the output of the "AND" gate 34 may be used as the $C_i$ clock signal 36 of the clock control signals $C_1$ through $C_N$ for controlling the shifting operations of the corresponding $R_i$ shift register. While the embodiment shown in FIG. 2 utilizes only a single phase clock signal for controlling the shifting operations of the shift register stages, it is understood by anyone of average skill in the pertinent art that multiple phase clocks may be added for the same purposes by a simple expansion of the embodiment without deviating from the basic structure thereof as will be more fully described below.

Figure 3:
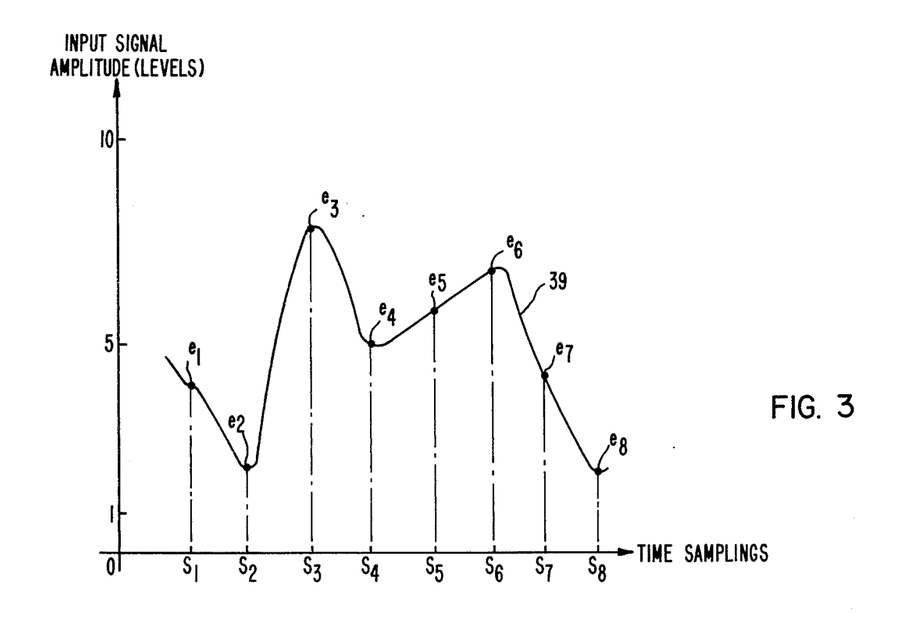
FIG. 3 depicts a waveform with suitable sampling values which may be typical of a source of data values for use by the embodiment of FIG. 1.
Figure 4:
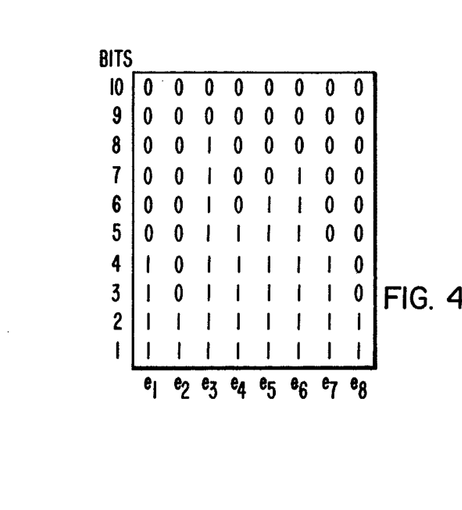
FIG. 4 exhibits the base-one coded digital words resulting from an A/D conversion of the data values $e_1$ through $e_8$ shown in FIG. 3.
Figure 5:
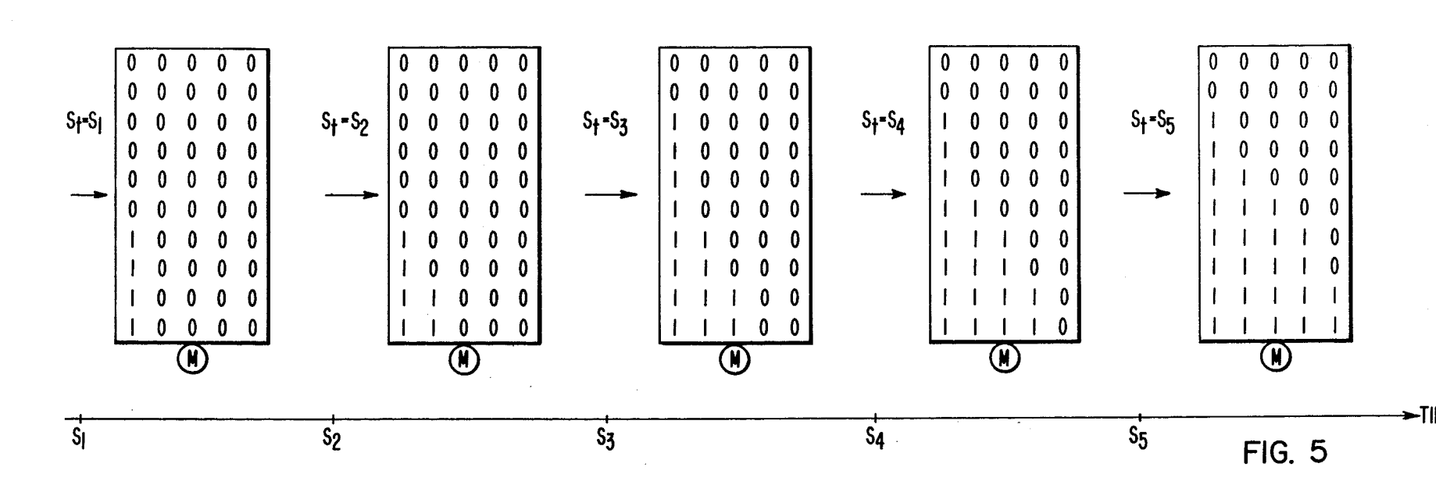
FIG. 5 displays chronologically a changing bit pattern arrangement of a memory bank which may be produced by a system similar to that shown in FIG. 1.

The operation of the system as shown in FIG. 1 may best be understood in connection with the description of FIGS. 3, 4 and 5. Referring to FIG. 3, a typical analog input waveform 10 is shown as curve 39. The clock sampling conversion times are denoted as $S_1, S_2, \ldots S_8$ and the respective data values on the analog waveform which are digitized by the A/D converter 12 at the sampling conversion times are denoted by points $e_1, e_2, \ldots e_8$. For the purposes of the embodiment being described, it is necessary for the A/D converter 12 to ultimately yield an N bit level base-one coded digital word for each conversion of data values, $e_1, e_2, \ldots e_8$. In some cases, it may be needed to transform from a conventionally converted base-two coded digital word to a base-one coded word which is a function well known to one skilled in the pertinent art. To simplify the description of this embodiment, specific numerical integer values may be associated with the more general terms of N and M. For example, N may be chosen as ten and M as five. Therefore, each converted base-one coded digital word has a range of ten bit levels and the memory bank may concurrently store only five digital words, for this example. The base-one coded digital words which may be ultimately converted from each of the data values $e_1, e_2, \ldots e_8$ are shown in FIG. 4. Since M has been arbitrarily chosen as five, it is only necessary to use the first five data values $e_1, e_2, \ldots e_5$ to describe the operation of the embodiment of FIG. 1.

In describing the operation of the processing system of FIG. 1, it will be assumed that the contents of the stages of the memory bank 22 are all initially zero. The operation may begin at sampling conversion $S_1$ at which time the A/D converter 12 digitizes the data value $e_1$ to a base-one coded digital word (refer to FIG. 4). The digital word of $e_1$ is presented over individual lines $D_1$, $D_2, \ldots, D_{N-1}, D_N$ to correspondingly associated shift registers $R_1, R_2, \ldots, R_{N-1}, R_N$ in the memory bank 22 and clock controllers in unit 20. Immediately subsequent to the conversion at time $S_1$, clock signals 24 are generated to the clock control unit 20 wherein individual shifting operations are controlled over control lines 26 on only selected shift registers as determined by the individual clock controllers of unit 20. Referring to FIG. 2, if the $D_i$ bit of the N-bit digital word ready for storage into the memory bank 22 over signal lines 18 has a status of digital one (logical true) then the "AND" gate 34 is considered enabled and the clock signals 24 are passed over signal lines 36 thereby to the M stages of the $R_i$ shift register for performance of the operation of shifting right one bit. On the other hand, if the $D_i$ bit of the N-bit level digital word has a status of digital zero (logical false), the "AND" gate function 34 is considered disabled and the clock signals 24 are inhibited from passing to the M stages of the $R_i$ shift register, thus no shifting operation is performed thereby. Thus, the control unit 20 performs a one bit shifting operation only on the shift register rows of the memory bank 22 which are correspondingly associated with bit levels of the storage ready digital word that have been determined to have a digital one status and the shifting operation is always in a direction to permit the digital one status levels of the storage ready digital word to be shifted into the first stage of their respective shift register rows of the memory bank 22.

The arrangement of the bit pattern of the memory bank 22 following the controlled shifting operation immediately subsequent to the sampling conversion $S_1$ of data value $e_1$ is shown in FIG. 5. Additionally exhibited in FIG. 5 is the bit arrangement of the memory bank 22 for each controlled shifting operations immediately subsequent to the sampling conversions $S_2, S_3, S_4, S_5$ respectively associated with the data values $e_2, e_3, e_4$ and $e_5$. The bit pattern of the memory bank 22, subsequent to the sampling conversion $S_5$ after having stored its capacity of five digital words, contains the status of the converted digital words in its columns, not in the sequential order in which they were presented thereto for storage, but in an order from right to left in relation to their magnitude. Thus, the processing system embodied in FIG. 1 has the capability of ordering a set of M, N-bit level, base-one coded digital words respectively converted from M data values in accordance with their magnitude in what appears to be as fast a time as it normally takes to perform M sampling conversions of M analog values to digital code and storage thereof without any additional time or apparatus required.

Accordingly, a readout tap 28 may be applied to the stages of any column for extracting a digital word representative of a desired threshold value of the ordered set of the M data values. One such threshold value is the median which may be extracted from the ordered set by simply applying the readout tap 28 to the stages of the middle column of an odd number of columns of the memory bank 22 as shown in FIG. 2. For the case of an even number of columns of the memory bank 22, it may be necessary to apply taps to the two adjacent columns closest the middle of the memory bank array for extracting two of the digital words contained therein. The average of the two extracted digital words provides a digital word representative of the median of an even numbered order set of data values.

It is understood that the N shift registers comprising the memory bank 22 shown in FIG. 1 may be implemented with any assortment of bipolar or field effect transistor circuits which may be configured to shift digital ones and zeroes thereacross. However, since it is desired that the memory bank and associated control circuitry be implemented using large-scale-integration (LSI) fabrication technology to provide the entire circuity on an LSI circuit chip, it is preferred that charge-coupled devices (CCD) be used as the stages of the shift registers of the memory bank 22. A block diagram schematic of a typical row in the memory bank of a CCD implemented shift register is shown in FIG. 6.

Figure 6:
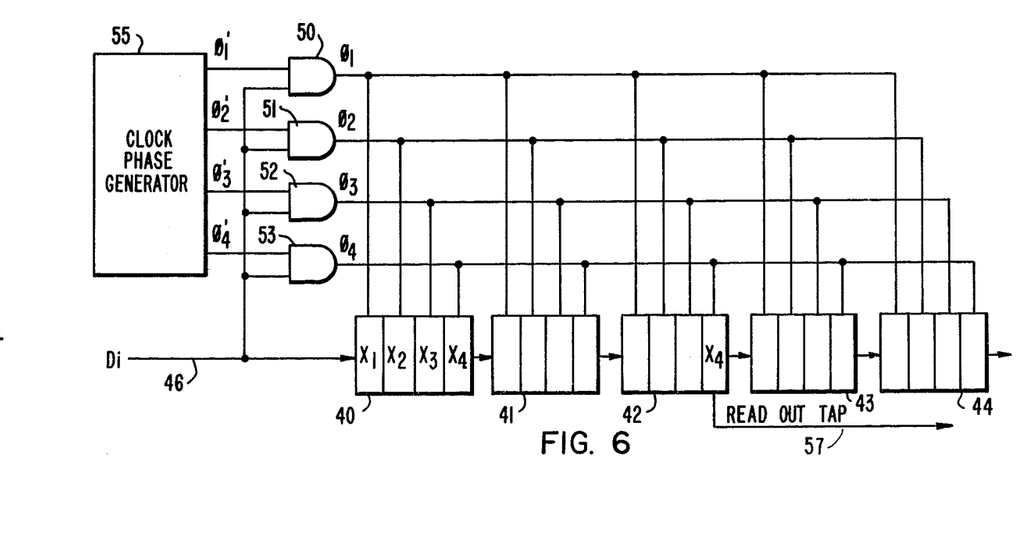
FIG. 6 is a schematic block diagram of one of the N-bit levels of a charge-coupled device shift register using a four-phase clock for control thereof.

Referring to FIG. 6, conventional surface P-channel type CCD cells utilizing a four-phase clock for operation thereof are functionally shown in a five-stage, shift register arrangement as cells 40, 41, ..., 44. The phases of the clock denoted as $\emptyset_1, \emptyset_2, \emptyset_3$, and $\emptyset_4$ are consecutively coupled to four sections $X_1, X_2, X_3$ and $X_4$ of each of the CCD stage cells 40 through 44. A signal representing the status of the digital bit $D_i$ is coupled to the first stage 40 of the CCD shift register associated therewith one signal line 46 and additionally to one input of each of four "AND" gate functions 50, 51, 52 and 53. Four clock phase signals $\emptyset_1', \emptyset_2', \emptyset_3'$, and $\emptyset_4'$ which are derived from a conventional clock phase generator 55, are respectively coupled to each of the second inputs to the "AND" gate functions 50 ..., 53. A readout tap 57 which may be of the type commonly referred to as a nondestructable tap may be applied to one of the sections of one of the CCD stages of the shift register for extracting the status of the bit information in the form of charge contained therein. The readout tap 57 is shown applied to section $X_4$ of the middle CCD stage 42 of the shift register for the purposes of extracting a digital word representative of a threshold value of the ordered set of digital words contained in the memory bank. In this case, the threshold value is the median.

Figure 7:
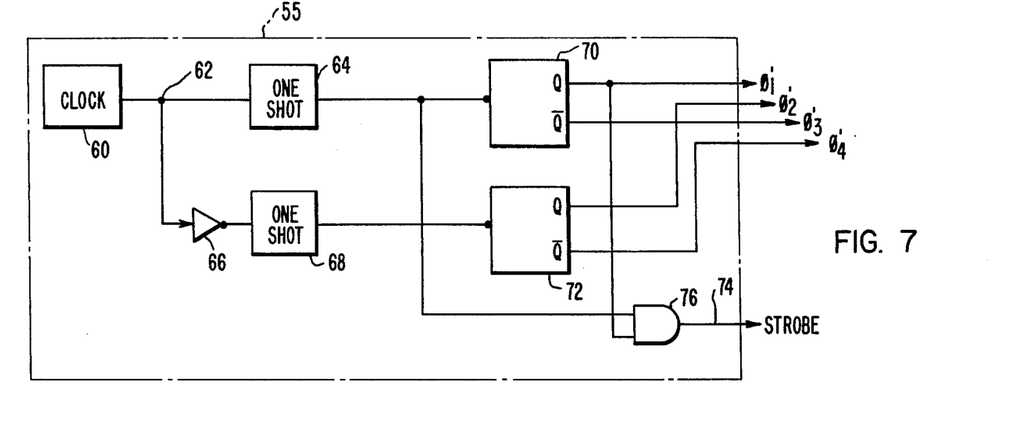
FIG. 7 is a schematic block diagram of a typical clock circuit which may be used to produce the four-phase clock signals and a timing signal.

The operation of the CCD memory bank described in connection with FIG. 6 is similar to that previously described except that the direction of the shifting operation is controlled by the order in which the phase of the clock $\emptyset_1', \emptyset_2', \emptyset_3'$, and $\emptyset_4'$ are sequenced as governed by the clock phase generator 55 and the manner in which the clock signals are eventually coupled to the sections of each of the CCD cells. One embodiment of a clock phase generator 55 is depicted functionally in FIG. 7. Referring to FIG. 7, a conventional clock circuit 60 provides a clock signal 62 to a conventional one-shot function 64 and an inverter function 66. The output of the inverter 66 is coupled to the input of another one-shot function 68. The outputs of the one-shots 64 and 68 are respectively coupled to the trigger inputs of two trigger-type flip-flop functions 70 and 72. The Q outputs of the flip-flops 70 and 72 are respectively associated with the clock signals $\emptyset_1'$, and $\emptyset_2'$. The $\overline{Q}$ of the flip-flops 70 and 72 are respectively associated with the clock signals $\emptyset_3'$, and $\emptyset_4'$. In addition, a STROBE timing signals 74 is produced at the output of an "AND" gate function 76 which has the output signal of the one-shot 64 and the Q output signal of the flip-flop 70 as its input.

Figure 8:
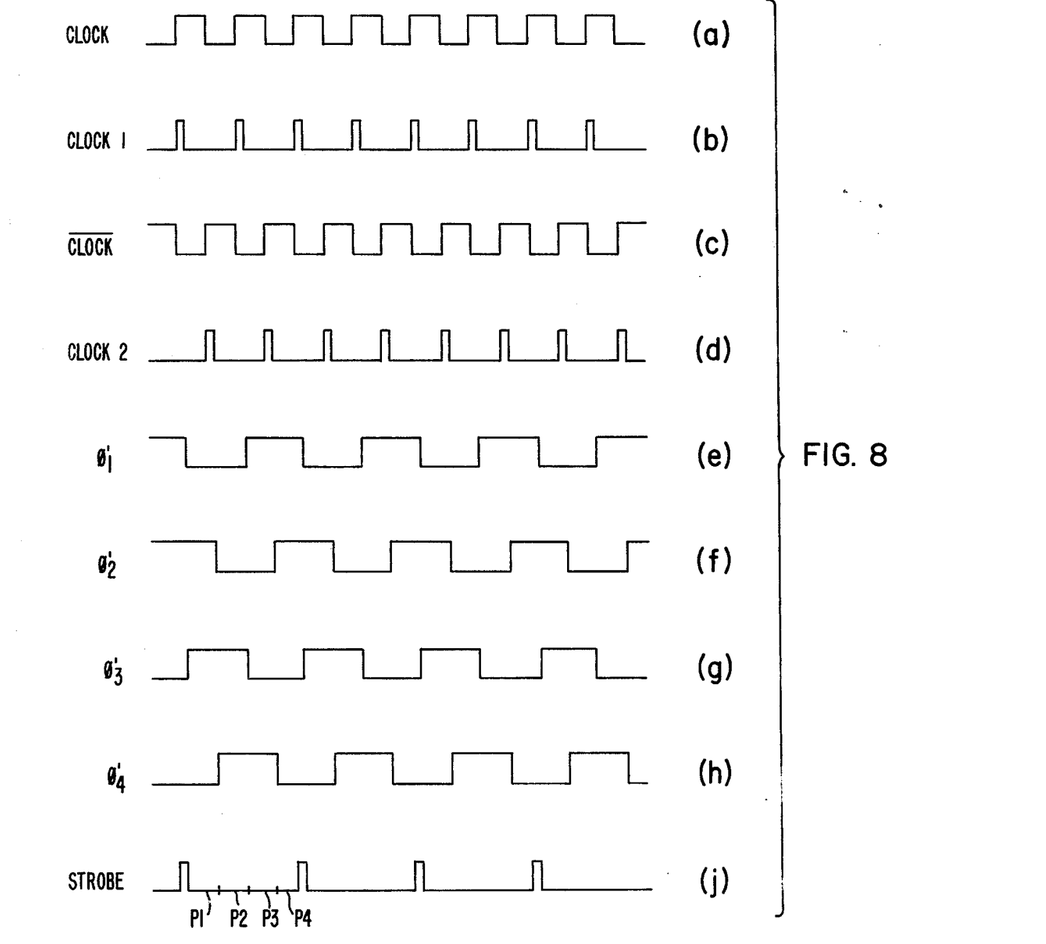
FIG. 8 reveals the waveforms which may result from the operation of a clock circuit similar to that displayed in FIG. 7.

The operation of the clock phase generator 55 may most easily be described in connection with the waveforms 8A through 8J of FIG. 8. The clock 60 generates a clock signal 62 similar to the waveform 8A. The one-shot 64 is responsive to one of either the leading or falling edges of the clock signal 62 to generate a train of pulses of predetermined width as shown in waveform 8B. The falling edge of each of these pulses of waveform 8B triggers the flip-flop 70 causing a change of state of its Q and $\overline{Q}$ outputs as depicted in waveforms 8E and 8G, respectively, which are representative of the clock signals $\phi_1'$ and $\phi_3'$. Additionally, the clock signal 62 is inverted by the inverter 66 resulting in a signal $\overline{CLOCK}$ which is similar to that depicted by waveform 8C. Similarly, the $\overline{CLOCK}$ signal triggers the one-shot 68 on one of either its leading or falling edges to produce a train of pulses similar to the waveform shown in 8D. The pulse train of waveform 8D is approximately 180° out-of-phase with the waveform 8B. The falling edge of each of the pulses of the output signal of one-shot 68 triggers the flip-flop 72 causing a change of state of its Q and $\overline{Q}$ outputs as depicted in waveforms 8F and 8H, respectively, which are representative of the clock signals $\phi_2'$ and $\phi_4'$. The STROBE signal '74 is depicted by waveform 8J which is shown in relation to the clock signals $\phi_1', \phi_2', \phi_3'$, and $\phi_4'$. There exists four time periods $P_1, P_2, P_3$ and $P_4$ between each STROBE pulse during which a charge signal may be conventionally shifted sequentially through the four sections $X_1, X_2, X_3$ and $X_4$ of each CCD cell (refer to FIG. 6) which may represent a surface P-channel type CCD. Other types of CCD can also be used for this application provided that the phasing of the clocks (see FIG. 8) are adjusted.

Each surface P-channel type CCD cell section is normally gated to accept the charge from an adjacent CCD cell section at times when the clock signal coupled thereto is of attracting (low) potential. The waveforms 8E through 8H exhibit overlapping low status gating of the clock signals during the four periods $P_1$, $P_2, P_3$ and $P_4$ between the STROBE pulses of waveform 8J. When the clock signals $\phi_1', \phi_2', \phi_3'$, and $\phi_4'$ are respectively coupled to the four adjacent sections of each CCD cell in a sense consecutively from left-to-right, the charge information, which may be representative of the bit status of digital words, is shifted from CCD cell to adjacent CCD cell from left-to-right. Accordingly, when the connection of $\phi_1'$ and $\phi_3'$ are interchanged providing a successive coupling pattern of the four sections $X_1, X_2, X_3$ and $X_4$ of each CCD cell with the clock signals $\phi_1', \phi_2', \phi_3'$, and $\phi_4'$, respectively, the charge storage information of each CCD cell is shifted from right-to-left. In either case, the charge storage information resides in the $X_4$ section at the occurrence of each STROBE pulse (see waveform 8J). While this bi-directional shifting control does not appear necessary for operation of the basic embodiment as depicted in FIG. 1, its importance will become more readily understood in the description of an alternative to the basic embodiment found hereinbelow. Further, it is understood by anyone of average skill in the art that the number of clock phase signals required to control the shifting operation of the shift registers may be in some cases reduced below four.

Figure 9:
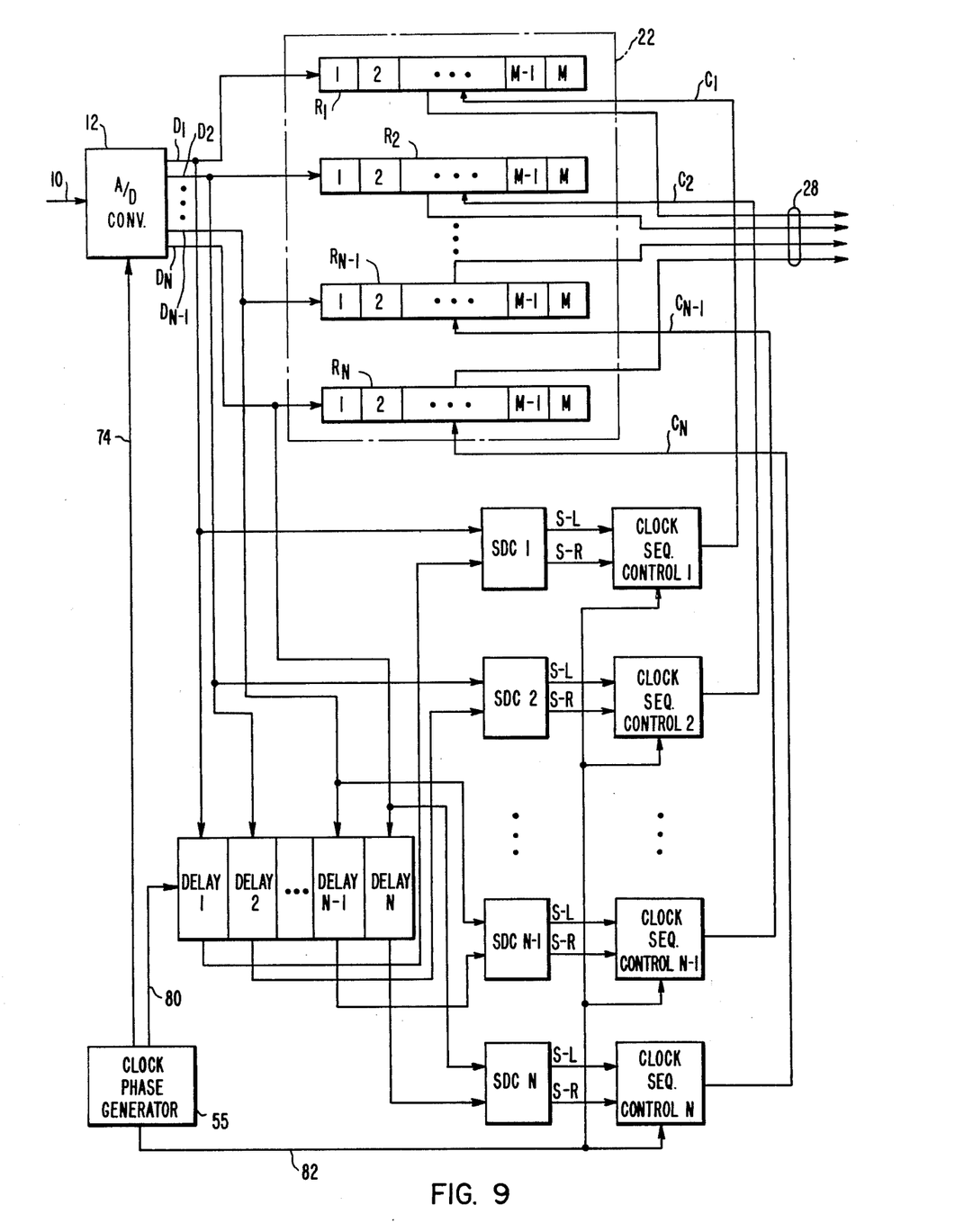
FIG. 9 is a schematic block diagram of an alternative embodiment of a processing system which may be used to embody the present invention.

At times when processing a train of data values such as the data values $e_1, e_2, \ldots e_8$ acquired from the sequential sampling conversions $S_1, S_2 \ldots S_8$ of the analog signal waveform 39 described in connection with FIG. 3, it is desired to continuously order, in accordance to magnitude, the most recent M data values and sequentially extract a predetermined threshold value from each of the most recent M data values of the data value train. A block diagram schematic of a processing system which is an alternative of the basic embodiment of FIG. 1 is shown in FIG. 9. This alternative embodiment comprises the addition of a set of shift direction controllers, a set of clock sequence controllers and a set of delay circuits to the basic embodiment of FIG. 1.

Referring to FIG. 9, the base-one coded digital output lines $D_1, D_2 \ldots, D_N$ of the A/D converter 12 are not only connected to shift registers $R_1$ through $R_N$ of the memory bank 22 as described in connection with FIG. 1, but are also connected to the inputs of a set of delay circuits DELAY 1, . . . , DELAY N and to the inputs of a set of shift direction controllers SDC 1, . . . , SDC N wherein there exists a one-to-one correspondence between each digital output line $D_i$ and each $SDC_i$ and $DELAY_i$. The outputs of each delay circuit $DELAY_i$ is connected to a second input of the corresponding shift directional controller $SDC_i$. The bit status of the digital data bit of signal line $D_i$ is compared to the delayed output of delay circuit $DELAY_i$ by the $SDC_i$ and in accordance with this comparison a decision is made on whether or not to shift the bit information of the shift register $R_i$ in memory bank 22 and in what direction, either shift-left, S-L or shift-right S-R, if a decision is made to shift. The shift direction controllers SDC1, . . . , SDC N each provide S-L and S-R control lines to a corresponding clock sequence controller of a set of clock sequence controllers CSC 1 through CSC N. The clock phase generator 55 provides the STROBE signal 74 to the A/D converter 12, clock signals 80 to each of the delay circuits DELAY 1, . . . , DELAY N, and clock signals 82 to each input of the clock sequence controller CSC 1, . . . , CSC N. The clock sequence controller outputs $C_1$ through $C_N$ are coupled to the shift registers $R_1$ through $R_N$, respectively. And as has been previously described in connection with FIG. 1, a predetermined column of shift register stages are tapped with taps 28 to extract a digital word which is representative of a threshold value of the digital words stored in the memory bank 22.

In operation, the clock phase generator 55 may utilize STROBE signal 74 to control a sequence of A/D conversions at predetermined sampling times $S_1, S_2 \ldots, S_8$ as previously described hereinabove (refer to FIGS. 3 and 4). Each of the converted base-one coded digital data words resulting from the sequence of conversions is delayed through M sequential A/D conversions by the delay circuits DELAY 1, . . . , DELAY N. After the memory bank 22 has initially stored the first M digital data words of the sequence of M A/D conversions, the bits of the next converted data word M + 1 over lines $D_1, \ldots D_N$ ready for storage in memory bank 22 are correspondingly compared with the bits of the delayed data word 1 which is presently appearing at the output of the delay circuits DELAY 1, . . . , DELAY N using each of the SDC circuits. Depending of the comparison strategy of each of the SDC circuits, an instruction is given to perform one of the following operations: (1) no shift; (2) shift-right, S-R; (3) shift-left, S-L. These instructions are provided to each of the CSC circuits over control lines S-L and S-R and as instructed the CSC circuits concurrently control their corresponding shift registers in accordance with the instructions provided thereto. These concurrent shifting operations may be sequentially performed subsequent to each A/D conversion and prior to the next A/D conversion. After each shifting operation is performed, an ordered set of the most recent M converted base-one coded data words is maintained in the shift registers of the memory bank 22. At these times, a threshold value may be extracted from the most recent M converted data over line 28.

Figure 10:
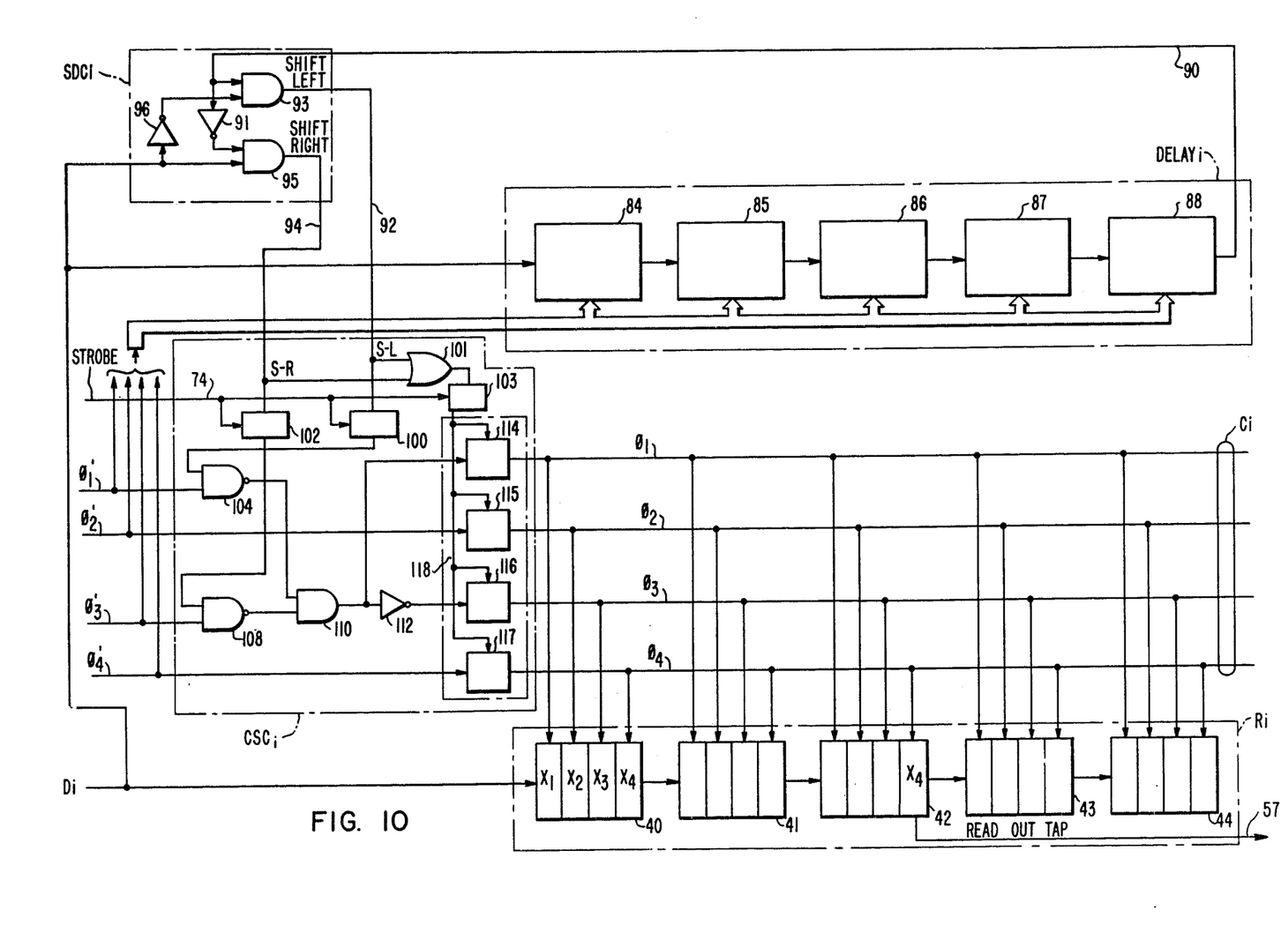
FIG. 10 is a schematic block diagram of one of the N-bit levels of a charge-coupled device shift register controller which is suitable for use in the embodiment shown in FIG. 9.

A more detailed schematic block diagram exemplifying an embodiment which may operate on one data bit $D_i$ is shown in FIG. 10. It is understood this embodiment is typical of the embodiments for all the data bits of the digital data lines $D_1, \ldots, D_N$ which carry the base-one coded data words sequentially converted by the A/D converter 12. Specifically for the purposes of describing the embodiment shown in FIG. 10, the M stages of the shift registers of memory bank 22 was equated to five and the N-bit base-one coded digital data words were limited to a capacity of ten bits. Referring to FIG. 10, the clock signals 80 which are comprised of the signals $\phi_1'$, $\phi_2'$, $\phi_3'$, and $\phi_4'$ are provided to each of the delay circuits DELAY$_i$ for the purposes of delaying each corresponding digital data bit $D_i$ ready for storage in the shift register $R_i$ through M (5) subsequent sequential sampling conversions of the A/D converter 12.

A shift register arrangement having five surface P-channel type CCD stages 84 through 88 was found to be a suitable delay circuit for this embodiment, but it is understood that other type delay circuits may be used. The shift register of circuit DELAY$_i$ is operative to perform one bit shifting operations from left to right in relation to each data word supplied thereto as controlled by the clock phase generator 55 which has been previously described in connection with FIGS. 7 and 8. Thus after five sequential data words, the bit information which was at the input to the stage 84 on signal line $D_i$ ends up at the output stage 88 of circuit DELAY$_i$. This bit information from the delayed digital word is coupled to the circuit SDC$_i$ over signal line 90 along with the corresponding bit information of the digital word ready for storage monitored from signal line $D_i$. Accordingly, the corresponding bits $D_1, D_2, \ldots, D_{N-1}$, $D_N$ of each digital word most recently converted by the A/D converter 12 and ready for storage in the memory bank 22 (refer to FIG. 9) are compared with each digital word correspondingly delayed through the most recent M (five) conversions by the set of shift directing controllers SDC 1 through SDC N. The result of these comparisons govern which shift register rows will be selected for a shifting operation and in which direction the shifting operation will be performed.

The comparison algorithm used for this embodiment may be mathematically expressed as follows:

| | (OLD) i,j | ∩ | (NEW) i,j+m = 1 | Clock disabled |
|---|---|---|---|---|
| | (OLD) i,j | ∪ | (NEW) i,j+m = 0 | Clock disabled |
| (1) | (OLD) i,j | ∩ | (NEW) i,j+m = 1 | Clock shift left |
| | (OLD) i,j | ∩ | (NEW) i,j+m = 1 | Clock shift right |

The subscripts (ij) refer respectively to the i input row of the memory bank and the second subscript j refers to the particular element from the data value ensemble. Note that the "New" and "Old" elements are separated by M data elements. Equations (1) above, governing the clock signals $\phi_1', \ldots, \phi_4'$ may be described as follows: if the (Old)$_{i,j}$ and (New)$_{i,j+m}$ bits are equal, no shifting is necessary; when the (Old)$_{i,j}$ bit is greater than the (New)$_{i,j+m}$ bit value, the ith row of the memory bank should be shifted left; and for the condition when the (Old)$_{i,j}$ bit is less than the (New)$_{i,j+m}$ bit, the clock should shift the ith row of the memory bank right. The embodiment of the clock sequence controller CSC$_i$ employing the (New)$_{i,j+m}$ signal $D_i$ and (Old)$_{i,j}$ signal 90 inputs may be embodied as shown in FIG. 10. Two different clock signals 92 and 94 are developed for shifting the ith row of the memory bank 22 either left or right depending on the input signals $D_i$ and 90.

One embodiment of the function expressed in equations (1) is shown in the dotted line surrounding circuit SDC$_i$ of FIG. 10. The input signal line 90 is coupled to one input of an "AND" gate function 93 and is also inverted by an inverter 91 whose output is coupled to one input of another "AND" gate function 95. The other input signal line $D_i$ is coupled to the second input of "AND" gate 95 and is inverted by an inverter 96 whose output is coupled to the second input of the "AND" gate 93. The output 92 of "AND" gate 93 controls the clock phase signals $\phi_1'$, $\phi_2'$, $\phi_3'$, and $\phi_4'$ to shift the ith row of the memory bank to the left one bit when both of its inputs are logically true (refer to equations (1) above). Accordingly, the output 94 of "AND" gate function 95 controls the clock phase signals $\phi_1'$, $\phi_2'$, $\phi_3'$, and $\phi_4'$ to shift the ith row of the memory bank to the right one bit when both of its inputs are logically true (refer to equations (1) above).

An embodiment of a clock sequence controller CSC$_i$ is also shown in FIG. 10. This embodiment is typical of all the clock sequence controllers CSC 1, . . . , CSC N and suitable for operation in the embodiment depicted in FIG. 9. The clock signals $\phi_1', \ldots, \phi_4'$ are inputs to the CSC$_i$ and the control line $C_i$ is the output of CSC$_i$ comprising clocks signals $\phi_1$, $\phi_2$, $\phi_3$, and $\phi_4$ which are respectively connected to the four sections of $X_1$, $X_2$, $X_3$ and $X_4$ of each surface P-channel type CCD cell 40 through 44 of the shift register $R_i$. In CSC$_i$, two conventional memory devices 100 and 102 have as their data inputs the signals 92 (S-L) and 94 (S-R), respectively. The two signals 92 and 94 are also input to an "OR" gate 101 which has an output connected to the data input of a third conventional memory device 103. The STROBE signal line 74 also developed from the clock phase generator 55 (not shown) is coupled to the gate inputs of each of the memory devices 100, 102 and 103. The data output of memory device 100 is connected to one input of a "NAND" gate function 104. And similarly, the data output of memory device 102 is connected to one input of a "NAND" gate function 108. Further, the clock signal $\phi_1$ is coupled to a second input to the "NAND" gate 104 and the clock signal $0_3'$ is coupled to a second input to the "NAND" gate 108. The outputs of the "NAND" gates 104 and 108 are coupled as inputs to an "AND" gate function 110 which has its output connected to one input of an "Inverter" gate function 112. The output of the "AND" gate function 110, the $\phi_2$ signal, the output of the gate 112, and the $\phi_4$ signal are correspondingly connected to the data inputs of a set of conventional quad latches 114 through 117 and the outputs of which are respectively used as the clock signals $\phi_1$, $\phi_2$, $\phi_3$, and $\phi_4$. The gate enable input 118 of the quad latches 114 through 117 is derived from the data output of the memory device 103.

The embodiments of SDC$_i$ and CSC$_i$ of FIG. 10 cooperate in operation to perform the tasks mathematically exhibited by equations (1) above. An example of such an operation may begin in time with a STROBE pulse on signal line 74. If the status of the bit information over lines 90 and $D_i$ are both zero or both one, the outputs of the "AND" gate functions 93 and 95 and the "OR" gate 101 will be zero (logically false) and this instructional information will be captured in the memory devices 100, 102 and 103 for the next clock sequencing period $P_1$ through $P_4$ as shown by the waveforms of FIG. 8. With the output 108 of the memory device 103 being zero, the state of the clock signals $\emptyset_1$, $\emptyset_2$, $\emptyset_3$, and $\emptyset_4$ at the outputs of the quad latches 114 through 117 respectively will remain fixed during the relevant clock sequencing period $P_1$ through $P_4$ because the outputs of the quad lathces, during the time when their gate enable is zero, are irresponsive to their data inputs. Consequently, no shifting operation is performed on the shift register $R_i$ when the status of the delay and ready-for-storage bits are both one or both zero, since all the clock signals $\emptyset_1$ through $\emptyset_4$ are maintained in a fixed state during the associated clock sequencing period.

Figure 11:
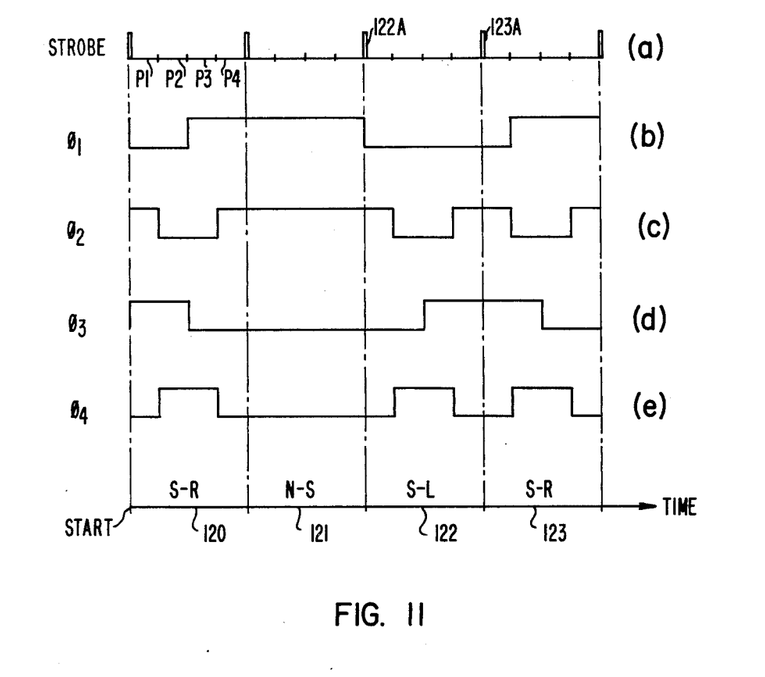
FIG. 11 is a set of waveforms which depict the operation of the embodiment of FIG. 10 for an exemplary set of conditions.

FIG. 11 depicts typical waveforms illustrating shifting or no shifting operation. The STROBE signal 74 is shown by waveform 11A and is used to define four clock sequencing periods 120, 121, 122 and 123. The waveforms 11B through 11E illustrate the resultant waveforms of $\emptyset_1$, $\emptyset_2$, $\emptyset_3$, and $\emptyset_4$ respectively as they are controlled by the $CSC_i$ in accordance with the stored instructions obtained from the $SDC_i$ at each occurrence of a STROBE pulse, for example. In the first period 120, the clock signals $\emptyset_1'$ through $\emptyset_4'$ are connected to signals $\emptyset_1$ through $\emptyset_4$, respectively, to produce the waveforms shown in FIG. 11 which are similar to the clock control which causes the shift register $R_i$ to shift right as has been previously described in connection with FIGS. 7 and 8 and which will be more fully understood by the description provided herebelow.

For the case above wherein the delayed and ready-for-storage bit status are both one or both zero, all of the clock signals are maintained fixed as shown for the period 121 of FIG. 11.

For the case in which the delayed bit status is a one and the ready-for-storage bit status is a zero, the "AND" gate function 93 will output a one status (logical true) over signal 92 to memory device 100, the "AND" gate function 95 will output a zero status (logical false) over signal line 94 to memory device 102 and the "OR" gate 101 will output a one status. The STROBE pulse 122A (see FIG. 11) captures this instruction information for the period 122 in the memory devices 100, 102 and 103. Consequently, only "NAND" gate function 104 will be enabled by the output signal of memory device 100 and the output of 104 is used to produce the proper phase for clock signals $\emptyset_1$ and $\emptyset_3$ for a shift left operation of shift register $R_i$. The clock signals $\emptyset_1$ through $\emptyset_4$ which may be used for a shift left operation are illustrated in waveforms 11B through 11E of FIG. 11 shown during period 122.

Finally, for the case in which the delayed bit status is a zero and the ready-to-store bit status is a one, the "AND" gate 95 will provide a one status (logical true) to memory device 102, and "AND" gate 93 will provide a zero status (logical false) to memory device 100 and the "OR" gate 101 will provide a one status to the memory device 103. This instructional information may be captured in memory devices 100, 102 and 103 for control of $CSC_i$ during the period 123 upon the occurrence of the STROBE pulse 123A. Consequently, the correct connections are made through use of the logic gates 104, 108 and 110 of $CSC_i$ to produce the proper phase for clock signals $\emptyset_1$ and $\emptyset_3$ for a shift right operation of shift register $R_i$. The clock signals which may be used for a shift operation are illustrated in waveforms 11B through 11E, during period 123 of FIG. 11. It is understood that some type of refresh clocking may be used at times to maintain the bit status in each of the shift register rows when CCD's are employed, but this refresh clocking is considered in no way to be part of the invention.

Figure 12:
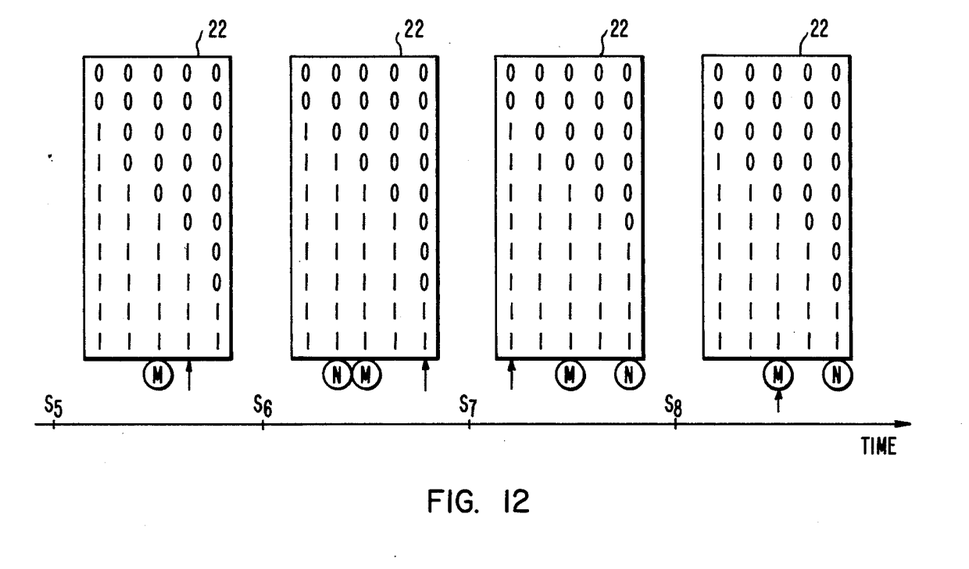
FIG. 12 displays chronologically a changing bit pattern arrangement of a memory bank which may be produced by a system similar to that shown in FIG. 9.

The operation of the overall embodiment shown in FIG. 9 may be further understood in connection with the description of FIG. 12 and Tables 1, 2 and 3 associated therewith. FIG. 12 illustrates the dynamic bit pattern arrangements of the memory bank 22 starting at a time subsequent to the sampling conversion time $S_5$ and prior to the sampling conversion time $S_6$, and ending at a time subsequent to the sampling conversion time $S_8$ and prior to the next sampling conversion time (not shown). The pattern of bits in the memory bank 22 are arranged in each sample such that with each storage of a most recent digital word (representative of a new data value) into the memory bank the oldest digital word stored therein is removed and an ordered set based on the magnitudes of the most recent M (five) digital words is maintained. A readout tap 57 is applied to the middle column 42 of the memory bank to extract a median value, denoted as M in FIG. 12, synchronous to the generation of each newly ordered set of the M (five) most recently converted digital words. The most recently stored digital word of the memory bank is denoted as $\overline{N}$ and the oldest digital word stored therein is denoted by the pointing arrow ↑ in FIG. 12.

As an example of the operation of the alternative embodiment shown functionally in FIG. 9, let initialization begin in time at a point subsequent to the sampling conversion $S_5$ and prior to the sampling conversion $S_6$ wherein the digital word representing the data value $e_5$ has been stored in an ordered set of the initial five digital words representing the data values $e_1$ through $e_5$ as shown in FIG. 12. At sampling time $S_6$, the data value $e_6$ is converted to the digital word corresponding thereto (refer to FIG. 4) and this digital word is presented to the memory bank as ready for storage. In addition, the digital word corresponding to the data value $e_1$ from the outputs of the delay circuits DELAY$_1$ through DELAY$_N$ is compared with the digital word of $e_6$ over data lines $D_1$ through $D_N$ which is ready for storage and the results of the corresponding bit comparisons as performed by the shift direction controllers $SDC_1$ through $SDC_N$ select the shift register rows in which a shifting operation is to be performed and further, controls the direction of shift in each of the rows. These control operations may best be described in connection with Table 1 found directly below:

TABLE 1

| Bit Level | $e_6$ | $e_1$ | Control Operation |
|---|---|---|---|
| 10 | 0 | 0 | No clock |
| 9 | 0 | 0 | No clock |
| 8 | 0 | 0 | No clock |
| 7 | 1 | 0 | S-R |
| 6 | 1 | 0 | S-R |
| 5 | 1 | 0 | S-R |
| 4 | 1 | 1 | No clock |
| 3 | 1 | 1 | No clock |
| 2 | 1 | 1 | No clock |
| 1 | 1 | 1 | No clock |

In performing the function in accordance with equation (1) above, the set of operations controlled by the sets of circuits shown typically by the cooperation of the $SDC_i$ and the $CSC_i$ circuits in FIG. 10 are performed on bit levels 5, 6, and 7 only as indicated by Table 1 above. Since in all cases, the new bit status is a digital one (true) and the corresponding old bit status is a zero (false), each of the shift register rows corresponding to bit levels 5, 6 and 7 will be controlled concurrently through a shift one bit right operation (S-R) rendering the bit pattern arrangement as shown subsequent to sampling conversion $S_6$ and prior to sampling conversion $S_7$ in FIG. 8. This bit pattern arrangement illustrates that the digital word representing the data value $e_6$ was entered in the second column of memory bank 22 maintaining an ordered set of the most recently converted five digital words. The median denoted by $\overline{M}$ may be extracted at this time for this ordered set and the oldest of the digital words stored is denoted by the pointing arrow ↑.

Another sequential conversion may be performed at sampling time $S_7$ which may correspond to the next STROBE pulse over signal line 74. The digital word representing the data value $e_7$ may thus be attained. This most recent converted digital word is presented to the memory bank as previously described as being ready for storage over data lines D1 through DN. At the same time, the digital words representing the data values $e_7$ and $e_2$, new and old respectively, are compared in the sets of circuits $SDC_i$ through $SDC_N$ and the results yielded therefrom are shown in Table 2 directly below.

TABLE 2

| Bit Level | $e_7$ | $e_2$ | Control Operation |
|---|---|---|---|
| 10 | 0 | 0 | No clock |
| 9 | 0 | 0 | No clock |
| 8 | 0 | 0 | No clock |
| 7 | 0 | 0 | No clock |
| 6 | 0 | 0 | No clock |
| 5 | 0 | 0 | No clock |
| 4 | 1 | 0 | S-R |
| 3 | 1 | 0 | S-R |
| 2 | 1 | 1 | No clock |
| 1 | 1 | 1 | No clock |

As a result of the comparison of $e_7$ and $e_2$ only rows corresponding to bit levels 4 and 3 need shifting and both of these rows 4 and 3 are concurrently shifted right one bit (S-R) rendering the bit pattern shown in FIG. 12 subsequent to sampling time $S_7$ and prior to the sampling time $S_8$. The digital word representing $e_7$ has been entered into the memory bank in the right most index column and the oldest digital word is removed with only the one bit shifting operation.

Similarly, a third sequential conversion is performed and a comparison is performed with the digital words representing the data values $e_8$ and $e_3$. The control operations resulting from this comparison are shown directly below in Table 3 and the bit pattern arrangement of the memory bank rendered therefrom is shown in FIG. 8 as being subsequent to the sampling time $S_8$.

TABLE 3

| Bit Level | $e_8$ | $e_3$ | Control Operation |
|---|---|---|---|
| 10 | 0 | 0 | No clock |
| 9 | 0 | 0 | No clock |
| 8 | 0 | 1 | S-L |
| 7 | 0 | 1 | S-L |
| 6 | 0 | 1 | S-L |
| 5 | 0 | 1 | S-L |
| 4 | 0 | 1 | S-L |
| 3 | 0 | 1 | S-L |
| 2 | 1 | 1 | No clock |
| 1 | 1 | 1 | No clock |

In all of the above cases, a new median value, for example, may be extracted from the threshold value tap 57 as each new ordered set is established immediately subsequent to each new digital word conversion.

While the preferred embodiments have been presented utilizing a surface P-channel type Charge Coupled Device (CCD) structure and multi-phase clocks in operation, it is understood by anyone of average skill in the art that other electronic technologies may have been used such as bipolar or insulated gate field effect transistors, for example, which may not require the multiphase clocking operation as described in detail above and still stay within the scope of the invention. In addition, while the preferred embodiment has been described in connection with an electronic system, it is further understood that equivalent processing systems including mechanical, pneumatic or hydraulic devices may also be used to embody the present invention without deviating from the broad principles of the invention as set forth in the claims found below.

I claim:

1. A system for processing a set of M data values to extract a desired threshold value therefrom, said system comprising:

means for converting each data value into a base-one coded digital word having a capacity of N-bit levels;

an M-stage shift register for each of said N levels of base-one code, said N number of M-stage shift registers being aligned in N rows and M columns to form a memory bank for storage of each of said M digital words in one of its M columns;

means for arranging the bit pattern of said memory bank upon storage of each digital word by performing a shifting operation on selected shift register rows, said selection of which being based on the base-one coded digital word ready for storage in the memory bank, said bit pattern arrangement of said memory bank rendering an ordered set of the digital words in relation to the magnitude thereof; and means for tapping the shift register stages of at least one predetermined column of said memory bank for extracting the digital words stored therein, whereby the extracted digital word may be, at times, representative of said desired threshold value of said ordered set of M data values.

2. A system in accordance with claim 1 wherein the bit pattern arranging means includes:

means for determining the status of each bit level of a digital word which is ready for storage in the memory bank; and means for performing a one bit shifting operation only on the shift register rows of the memory bank which are correspondingly associated with the bits of said storage-ready digital word that have been determined to have a digital one status, said shifting operation being in a direction to cause a digital one status to be stored into the input stage of the shifted rows of the memory bank.

3. A system in accordance with claim 1 wherein the number of shift register stages M is odd; and wherein the middle column of the M shift register stages is tapped by the tapping means for extracting a digital word representative of the median value of the ordered set of data values stored in the shift register stages.

4. A system in accordance with claim 1 wherein the number of shift register stages M is even; and wherein the two adjacent columns closest the middle are tapped by the tapping means for extracting two digital words, the average of said two digital words being representative of the median value of the ordered set of data values stored in the shift register stages.

5. A system for processing a set of M base-one coded digital words, each having a capacity of N-bit levels, to extract a desired threshold digital word therefrom, said system comprising:

an M stage shift register for each of said N levels of base-one code, said N number of M stage shift registers being aligned in N rows and M columns to form a memory bank for storage of each of said M digital words in one of its M columns;

means for sequencing the storage of the M base-one coded digital words into said memory bank;

control means governed by the sequencing means and the status of the bit levels of the base-one coded digital word ready for storage in the memory bank to perform a concurrent shifting operation on only selected shift register rows upon each sequential storage of a ready-to-store digital word in said memory bank such that the bit pattern of said memory bank is arranged in an ordered set of digital words based on magnitude after each sequential storage of a digital word; and means for tapping the shift register stages of at least one predetermined column of said memory bank for extracting the digital words stored therein after said M digital words have been stored in said memory bank in said ordered set, whereby the extracted digital word is representative of the desired threshold value of said ordered set of M data values.

6. The system in accordance with claim 5 wherein the control means performs a one-bit shifting operation only on the shift register rows of the memory bank which are correspondingly associated with the bits of said storage-ready digital word that have been determined to have a digital one status, said shifting operation being in a direction to permit the status of the levels of the storage-ready digital word determined to be a digital one to be shifted into their respective rows of the memory bank.

7. A system for processing a set of M base-one coded digital data words, each having a capacity of N-bit levels, to extract a desired threshold digital data word therefrom, said system comprising:

an M-stage shift register for each of said N levels of base-one code, said N number of M stage shift registers being aligned in N rows and M columns to form a memory bank for sequentially storing each of said M digital words in one of its M columns;

means for controlling the sequential storage of each digital data word in the memory bank in an ordered set based on the magnitude of the data words by concurrently shifting selected shift register rows one bit at the time of storage of each of said digital data words; and means for tapping the shift register stages of at least one predetermined column of said memory bank for extracting the digital words stored therein, whereby the extracted digital word may be, at times, representative of the desired threshold value of said ordered set of M data values.

8. A system in accordance with claim 7 wherein the controlling means includes:

means for determining the status of each bit level of a digital word which is ready for storage in the memory bank; and means for concurrently shifting one bit each of the shift register rows of the memory bank which are correspondingly associated with the bits of said storage-ready digital word that have been determined to have a digital one status, said one bit shifting operation being performed at the time of storage of each digital word and in a direction to permit the status of the levels of the storage-ready digital word determined to be a digital one to be shifted into their respective rows of the memory bank.

9. A system in accordance with claim 7 wherein each stage of the shift registers constituting the memory bank are charge-coupled device cells having a plurality of sections to allow charge representative of the status of a bit level of a digital word to shift adjacently from cell to cell.

10. A system in accordance with claim 9 wherein the tapping means of the charge-coupled device shift registers are non-destructable readout taps.

11. A system for processing a sequential train of base-one coded digital data words, each having a capacity of N-bit levels, for extracting a desired threshold digital data word from each most recent M digital data words of said train, said system comprising:

a set of N shift registers each having M stages and aligned in N rows and M columns to form a memory bank for sequentially storing each of the M most recent digital words of said sequential train in one of its M columns, a data word in said train of data words which is ready for storage in said memory bank being denoted as M + i and an oldest data word of the M most recent data words stored in said memory bank being denoted as i;

control means governed by each M + i data word and corresponding i data word of said train of digital data words to perform a shifting operation on selected shift register rows of said memory bank to arrange the most recent M digital data words of said train in the columns of said memory bank in an ordered array based on the magitudes thereof;

tapping means coupled to a predetermined column of said memory bank for extracting a digital data word stored therein, whereby each extracted digital word may be, at times, representative of said desired threshold value of the ordered array of the most recent M digital data words.

12. The system in accordance with claim 11 wherein the control means performs a shift right one-bit operation on the shift registers associated with the bit levels of each M + i digital word which has a status substantially greater in magnitude than the corresponding bit levels of the respective i digital word associated therewith to cause a status of one to be stored into each first stage of said right shifted shift registers; and wherein the control means performs a left shift one-bit operation on the shift registers associated with the bit levels of each M + i digital word which has a status substantially lower in magnitude than the corresponding bit levels of the respective i digital word associated therewith to cause a status of zero to be stored into each Mth stage of said left-shifted shift registers.

13. The system in accordance with claim 12 wherein the control means performs both the shift right and shift left operations concurrently with the storage of each digital word of said sequential train of digital words in said memory bank.

14. A system in accordance with claim 11 wherein the number of shift register stages M is odd; and wherein the middle column of the M shift register stages is tapped by the tapping means for extracting a digital word representative of the median value of the ordered set of data values stored in the shift register stages.

15. A system in accordance with claim 11 wherein the number of shift register stages M is even; and wherein the two adjacent columns closest the middle are tapped by the tapping means for extracting two digital words, the average of said two digital words being representative of the median value of the ordered set of data values stored in the shift register stages.

16. A system for continuously processing each most recent M data values in a sequential train of data values for extracting a desired threshold value from each most recent M data values of said train, said system comprising:
means for sequentially converting each data value in said train of data values into a base-one coded digital word having a capacity of N-bit levels;
means for delaying each converted digital word through M subsequent sequential conversions of data values into digital words;
a set of N shift registers each having M stages and aligned in N rows and M columns to form a memory bank for storage of each of the M most recently converted digital words in one of its M columns;
means for arranging the bit pattern of said memory bank upon storage of each most recently converted digital word by performing one of two shifting operations on only selected shift register rows, said shifting operation and selection of shift register rows being governed by a comparison of each digital word most recently converted which is ready for storage in said memory bank and each digital word correspondingly delayed through the most recent M conversions, said bit pattern arrangement of said memory bank continuously rendering an ordered set of the most recent M sequentially converted digital words in accordance with the magnitude thereof; and
means for tapping the shift register stages of a predetermined column of said memory bank for extracting the digital word stores therein for each ordered set of the most recent M sequentially converted digital words, whereby each extracted digital word is representative of a desired threshold value of the most recent M data values of said train of data values.

17. The system in accordance with claim 16 wherein the delaying means comprises an M-stage shift register for each of the N levels of the converted digital data words, said N shift registers being aligned in N rows and M columns to form a dynamic memory bank; and wherein the converted digital words are shifted in one direction through the dynamic memory bank sequentially between adjacent columns in relation to the sequential conversions being performed by the converting means such that a converted digital word appearing at the input column of the dynamic memory bank will eventually appear at the output column after M subsequent conversions.

18. The system in accordance with claim 16 wherein the bit pattern arranging means includes:
means for comparing the status of each of the bit levels of a first digital word which is the most recently converted digital word with the corresponding bit levels of a second digital word which is the digital word delayed through M preceding conversions to generate:
(a) a first signal for each bit level of said first digital word which has a status that is substantially greater than that of the corresponding bit level of said second digital word;
(b) a second signal for each bit level of said first digital word which has a status that is substantially less than that of the corresponding bit level of said second digital word; and
(c) a third signal for each bit level of said first digital word which has a status that is substantially equal to that of the corresponding bit level of said second digital word;
a first means governed by said first signals to control a shift right one-bit operation on the shift registers of the memory bank which are associated with said first signal which causes a status of one to be stored into each said first stage of right shifted shift registers;
a second means governed by said second signal to control a shift left one-bit operation on the shift registers of the memory bank which are associated with said second signals which causes a status of zero to be stored into each Mth stage of said left shifted shift registers; and
a third means governed by said third signal to inhibit all shifting operations on the shift registers of the memory bank which are associated with said third signals.

19. The system in accordance with claim 18 wherein the shift left one-bit and shift right one-bit operations are performed concurrently upon storage of each newly converted digital word into the memory bank.

20. The system in accordance with claim 16 wherein the stages of the shift registers in the memory bank are charge-coupled devices having a plurality of sections which are used for transferring charge which is representative of the status of the bit levels of the digital words between adjacent stages.

21. A system in accordance with claim 20 wherein the tapping means of the charge-coupled device shift registers are non-destructable readout taps.

* * * * *